US012096555B2

(12) United States Patent
Leitgeb et al.

(10) Patent No.: US 12,096,555 B2
(45) Date of Patent: Sep. 17, 2024

(54) COMPONENT CARRIER WITH STACK-STACK CONNECTION FOR CONNECTING COMPONENTS

(71) Applicant: AT&S Austria Technologie & Systemtechnik Aktiengesellschaft, Leoben (AT)

(72) Inventors: Markus Leitgeb, Trofaiach (AT); Gernot Grober, Weisskirchen (AT)

(73) Assignee: AT&S Austria Technologie & Systemtechnik AG, Leoben (AT)

(*) Notice: Subject to any disclaimer, the term of this patent is extended or adjusted under 35 U.S.C. 154(b) by 0 days.

(21) Appl. No.: 17/655,162

(22) Filed: Mar. 16, 2022

(65) Prior Publication Data
US 2023/0300982 A1   Sep. 21, 2023

(51) Int. Cl.
*H05K 1/11* (2006.01)
*H05K 1/18* (2006.01)
(Continued)

(52) U.S. Cl.
CPC ............. *H05K 1/113* (2013.01); *H05K 1/181* (2013.01); *H05K 1/186* (2013.01); *H05K 3/341* (2013.01);
(Continued)

(58) Field of Classification Search
CPC ........ H05K 1/113; H05K 1/181; H05K 1/186; H05K 3/341; H05K 3/429; H05K 2201/094; H05K 1/0271; H05K 1/183; H05K 3/4694; H05K 1/185; H05K 3/4602; H05K 2201/09227; H05K 2201/09545; H05K 2201/09563; H05K 2201/09672; H01L 23/49822; H01L 23/49838

See application file for complete search history.

(56) References Cited

U.S. PATENT DOCUMENTS

2018/0323150 A1 * 11/2018 Yu ..................... H01L 25/0655
2020/0035606 A1    1/2020 Bhagavat et al.
(Continued)

OTHER PUBLICATIONS

Engel, L.; Extended European Search Report in Application No. EP 23160513.0; pp. 1-12; Aug. 31, 2023; European Patent Office, 80298, Munich, Germany.

*Primary Examiner* — Ishwarbhai B Patel
(74) *Attorney, Agent, or Firm* — Robert A. Blaha; Smith Tempel Blaha LLC

(57) ABSTRACT

A component carrier includes a first stack with an electrically insulating layer structure and an electrically conductive layer structure with a first density of trace structures and a second density of first connection structures, a second stack with a second electrically insulating layer structure and a second electrically conductive layer structure with a third density of second trace structures and a fourth density of second connection structures. A first component is applied to the first stack and a second component is embedded in the second stack. The first connection structures are respectively connected to the second connection structures. The first density of first trace structures is lower than the third density of second trace structures. The first stack and the second stack are connected with each other by the first connection structures and by the second connection structures. The first component is connected to the second component.

14 Claims, 5 Drawing Sheets

(51) Int. Cl.
  *H05K 3/34* (2006.01)
  *H05K 3/42* (2006.01)
  *H01L 23/498* (2006.01)
  *H05K 1/02* (2006.01)

(52) U.S. Cl.
  CPC ........ *H05K 3/429* (2013.01); *H01L 23/49822* (2013.01); *H01L 23/49838* (2013.01); *H05K 1/0271* (2013.01); *H05K 1/183* (2013.01); *H05K 1/185* (2013.01); *H05K 2201/094* (2013.01)

(56) References Cited

U.S. PATENT DOCUMENTS

| | | |
|---|---|---|
| 2020/0388600 A1* | 12/2020 | Huang .................. H01L 21/563 |
| 2020/0395280 A1 | 12/2020 | Chen et al. |
| 2021/0028145 A1 | 1/2021 | Yu et al. |
| 2021/0202427 A1* | 7/2021 | Tuominen ............ H05K 3/4682 |
| 2021/0280565 A1 | 9/2021 | Huang et al. |
| 2021/0335715 A1 | 10/2021 | Kao |

* cited by examiner

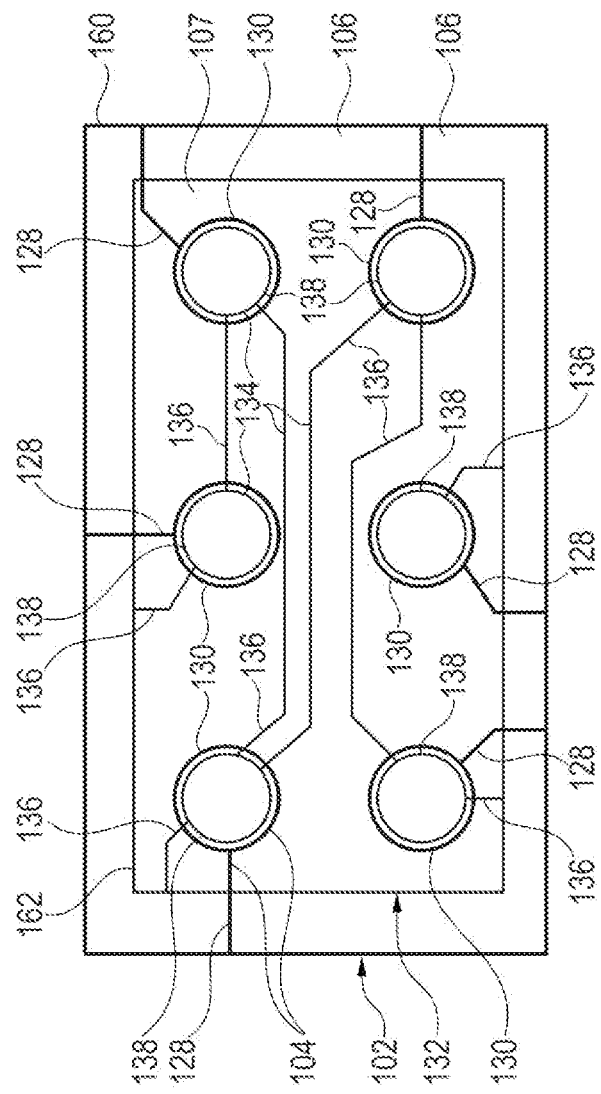
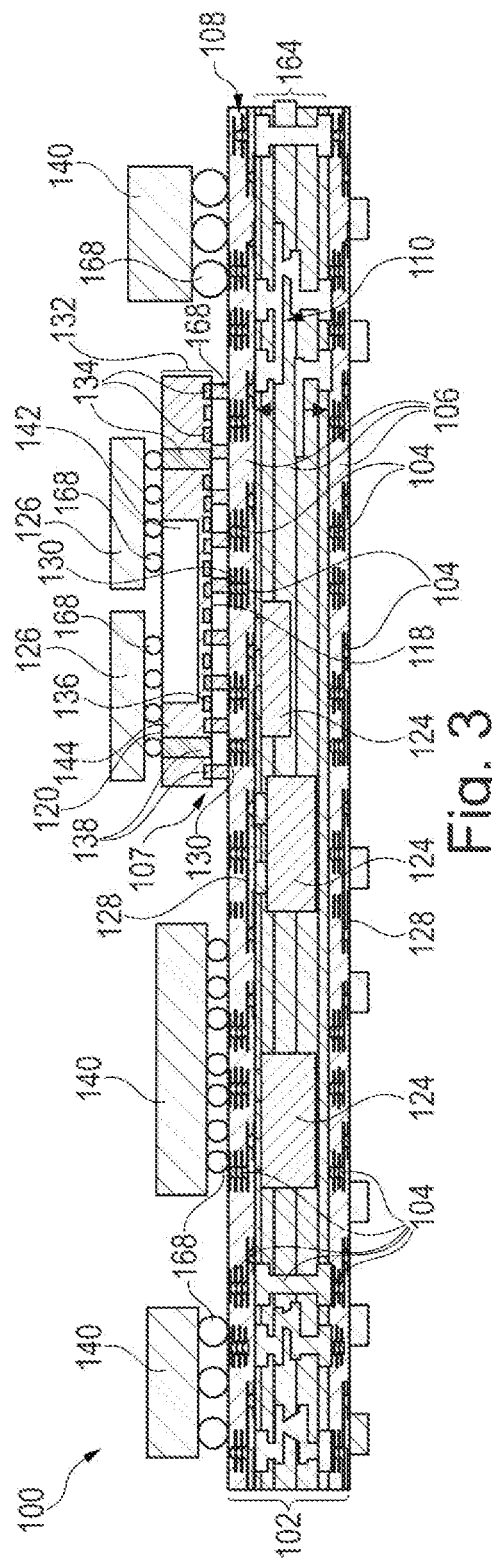

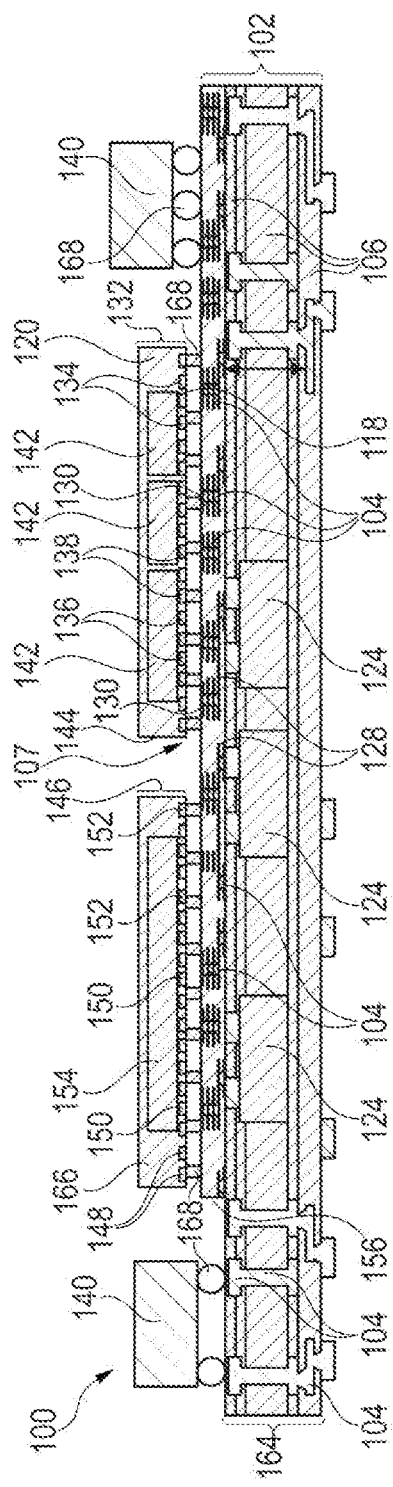
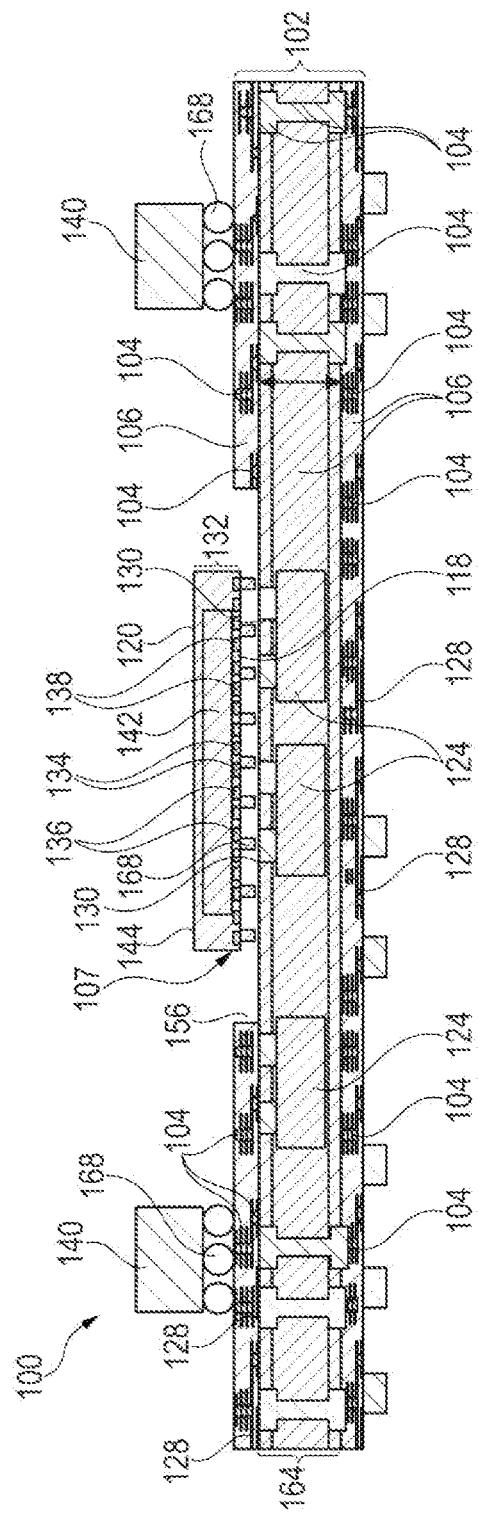
Fig. 4
Fig. 5

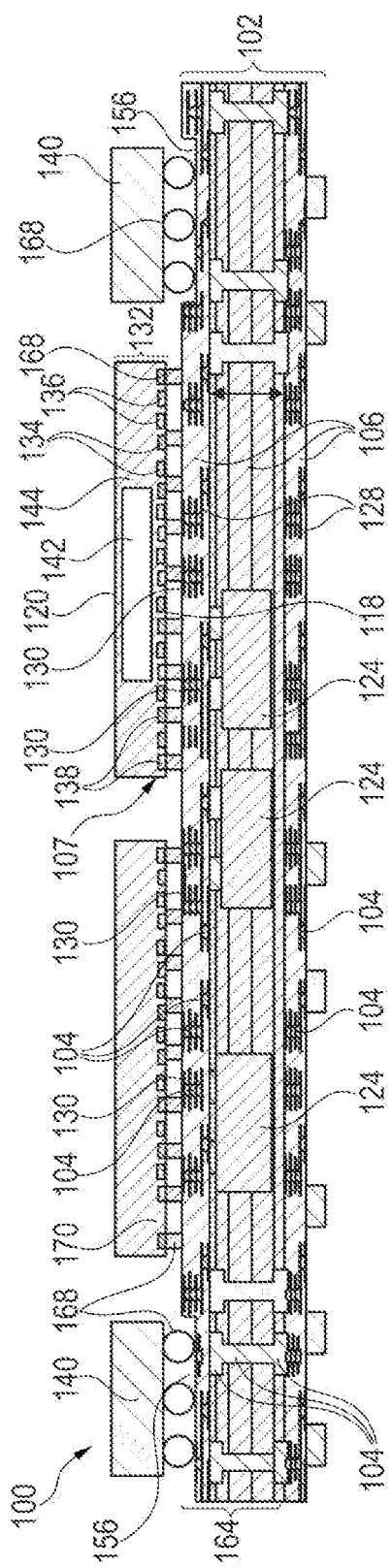
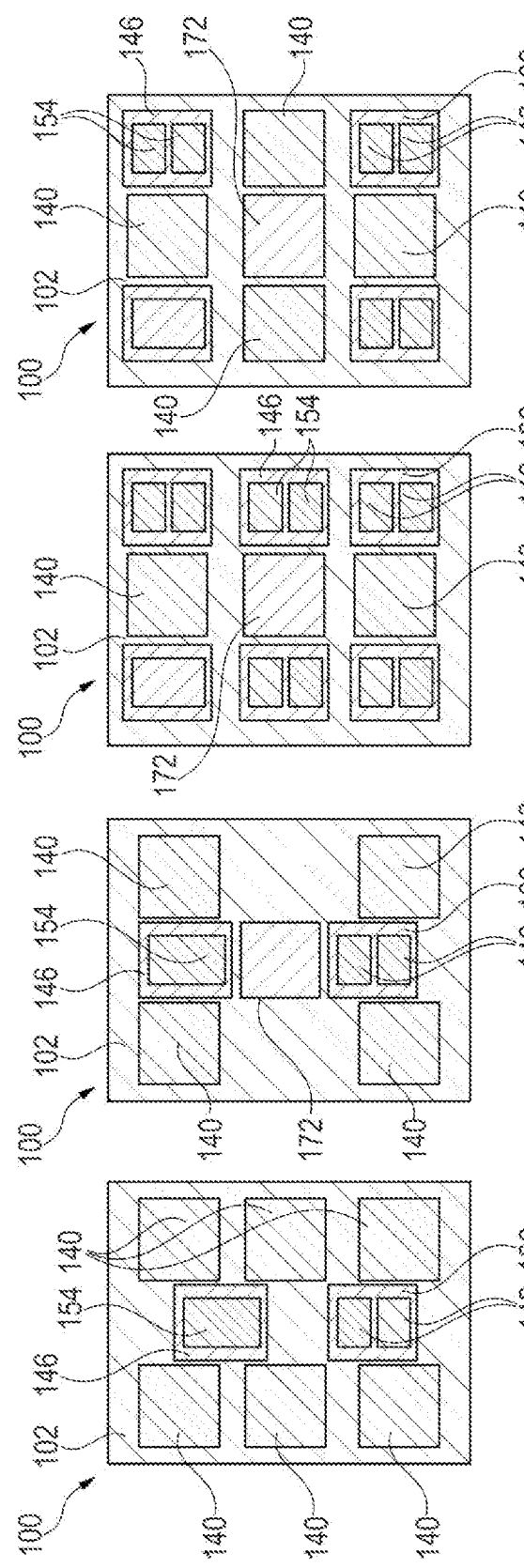

COMPONENT CARRIER WITH STACK-STACK CONNECTION FOR CONNECTING COMPONENTS

TECHNICAL FIELD

The disclosure relates to a component carrier and to a method of manufacturing a component carrier.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Electrically connecting components assigned to a component carrier is however still a challenge.

SUMMARY

There may be a need for a component carrier with assigned components being manufacturable simply and with high reliability.

According to an exemplary embodiment of the disclosure, a component carrier is presented. The component carrier comprises a first stack comprising an electrically insulating layer structure and an electrically conductive layer structure at least part of which having a first density of first trace structures and a second density of first connection structures, the first trace structures and the first connection structures are connected; a second stack comprising a second electrically insulating layer structure and a second electrically conductive layer structure having a third density of second trace structures and a fourth density of second connection structures, wherein the second trace structures and the second connection structures are connected; at least one first component applied to the first stack and at least one second component embedded in the second stack wherein the connection structures are respectively connected to the second connection structures, wherein the first density of first trace structures is lower than the third density of second trace structures, wherein the first stack and the second stack are connected with each other by the first connection structures of the first stack and by the second connection structures of the second stack, and wherein the at least one first component is connected to the at least one second component.

According to another exemplary embodiment of the disclosure, a method of manufacturing a component carrier is presented. The method comprises providing a first stack comprising an electrically insulating layer structure and an electrically conductive layer structure at least part of which having a first density of first trace structures and a second density of first connection structures, providing a second stack comprising at least one second electrically insulating layer structure and a second electrically conductive layer structure having a third density of second trace structures and a fourth density of second connection structures, applying at least one first component to the first stack, and embedding at least one second component in the second stack, providing the first stack and the second stack so that the second density of first connection structures and the fourth density of second connection structures differ from each other by not more than +/−20%, providing the first stack and the second stack so that the first density of first trace structures is lower than the third density of second trace structures, connecting the first stack and the second stack with each other by the first connection structures of the first stack and by the second connection structures of the second stack, and connecting the at least one first component to the at least one second component.

According to still another exemplary embodiment of the disclosure, a component carrier is provided which comprises a first stack comprising an electrically insulating layer structure and an electrically conductive layer structure at least part of which having a first density of first trace structures and a second density of first connection structures, a second stack comprising a second electrically insulating layer structure and a second electrically conductive layer structure having a third density of second trace structures and a fourth density of second connection structures, and at least one first component applied to the first stack, wherein the first connection structures are respectively connected to the second connection structures, wherein the first density of first trace structures is lower than the third density of second trace structures, wherein the first stack and the second stack are connected with each other by the first connection structures of the first stack and by the second connection structures of the second stack, and wherein the electrically insulating layer structure comprises at least two sub-structures made of different dielectric materials.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer body, such as a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote a flat or planar sheet-like body. For instance, the stack may be a layer stack, in particular a laminated layer stack or a laminate. Such a laminate may be formed by connecting a plurality of layer structures by the application of mechanical pressure and/or heat.

In the context of the present application, the term "layer structure" may particularly denote a continuous layer, a patterned layer or a plurality of non-consecutive islands within a common plane.

In the context of the present application, the term "component" may particularly denote a device, for instance fulfilling an electronic and/or a thermal task. For instance, the component may be an electronic component. Such an electronic component may be an active component such as a semiconductor chip comprising a semiconductor material, in particular as a primary or basic material. Said semiconductor chip may for example be an active semiconductor chip or a passive semiconductor chip (such as a bridge chip). The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "trace structure" may particularly denote an elongate element of an electrically conductive layer structure. For instance, such an elongate element may be straight, curved and/or angled. A trace structure may extend within a horizontal plane. Different horizontal trace structures may be connected with each other by perpendicular or vertical connection structures. An example of a trace structure is a wiring. For instance, a trace structure may interconnect connection structures, components, vertical through connections and/or other trace structures. For example, a trace structure may extend within a horizontal plane.

In the context of the present application, the term "connection structure" may particularly denote a laminar element of an electrically conductive layer structure. For instance, such a laminar element may be flat or two-dimensional, such as a pad. However, a connection structure may also be three-dimensional and/or may extend vertically, such as a pillar or cylinder. Based on the formation of trenches, it is also possible to provide a vertical connection with rectangular (in particular square) footprint. For instance, a connection structure may contribute to a connection between different stacks, in particular by forming part of one stack and being connected with another connection structure of another stack. For example, a connection structure may also be connected to other connection structures, components, vertical through connections and/or trace structures. Apart from connection structures (see reference signs 130, 138) which form part of a respective stack, connection elements (see reference sign 168) may be provided for interconnecting stacks, a stack with a component, or a component with another component.

In the context of the present application, the term "density of structures" may particularly denote a number of structures per area. For example, a density of connection structures 130 of stack 102 according to FIG. 2 may be the ratio between the number of connection structures (six in FIG. 2) of the stack divided by the surface area of the outer rectangle 160 of FIG. 2. However, the term "density of structures" may also denote a number of structures per volume. The mentioned density may be an integration density, i.e., a number of electrically connected structures integrated in the respective stack per stack area or per stack volume.

In the context of the present application, the term "the second density and the fourth density differ from each other by not more than +/−20%" may particularly denote that a ratio of, on the one hand, the difference between the second density and the fourth density of connection structures, divided by, on the other hand, the larger of the second density and the fourth density of connection structures, has an absolute value of not more than 0.2. In the context of the present application, corresponding percentages shall be calculated according to the aforementioned rule.

In the context of the present application, the term "component applied to a stack" may particularly denote a component being surface-mounted to the stack or being embedded in the stack.

According to exemplary embodiments of the invention, a component carrier is provided which comprises (at least) two stacks which may be arranged on top of each other. At least two components (for example semiconductor chips) of such a component carrier shall be electrically connected with each other, so that they can cooperate functionally. The components may be assigned to the different stacks. In order to properly couple the components in a compact way, at least one of said components may be embedded in the respective stack. Furthermore, the components may be connected with each other by electrically conductive trace structures and electrically conductive connection structures. Although being connected with each other, the stacks may have even significantly different densities of trace structures, which increases the freedom of design. However, for properly connecting the stacks with each other without the need of providing a redistribution structure in between, the density of connection structures of the stacks may be very similar, to thereby ensure a matching connection geometry of both stacks. As a result, a compact design and a reliable electric coupling of the components may be ensured. The division of the electrical structures into the trace structures and further trace structures according to embodiments of the invention may allow the complexity to be unbundled. Moreover, this may enable a uniform structuring of the layers in the further layer structure and may thus simplify the design of the package.

In the following, further exemplary embodiments of the manufacturing method, and the component carrier will be explained.

In an embodiment, the at least one first component and the at least one second component may be connected directly or indirectly with each other. For example, said connection may be internally or externally of the stacks. For instance, said connection may be through said trace structures and said connection structures.

In an embodiment, the at least one first component comprises at least one component being embedded in the stack and/or at least one component being surface mounted on the stack. In the context of the present application, the term "embedded component" may particularly denote a component being arranged partially or entirely inside the stack. This may be accomplished by fully circumferentially surrounding the component with stack material. However, this may also be done by inserting the component in a recess or cavity of the stack while an upper main surface and/or side wall portions of the component may extend partly or entirely out of the stack. Component embedding may lead to a compact design. In contrast to this, a surface mounted component may be attached on an exterior main surface of the stack and may be connected here electrically and mechanically. Surface mounting of a component may simplify the manufacture of the component and removal of heat of the surface mounted components during operation of the component carrier.

The stacks may have a sheet (or plate) like design comprising two opposing main surfaces. The main surfaces may form the two largest surface areas of the stack. The main surfaces are connected by circumferential side walls. The thickness of a stack is defined by the distance between the two opposing main surfaces. The main surfaces may comprise functional sections, such as conductive traces or conductive interconnections with further elements, such as one or more integrated circuits (ICs).

In an embodiment, the at least one second component is encapsulated by an electrically insulating encapsulant. Such an encapsulant may be embodied, for example, as a mold structure (like an epoxy mold compound). In another example, also a dielectric layer (for example a build-up film or a solder resist, for example comprising an epoxy material)

or a coating may act as an encapsulant. By encapsulation, the second component may be protected mechanically and may be isolated electrically with regard to an environment to thereby improve the electrical and mechanical reliability of the component carrier.

In an embodiment, the electrically conductive layer structures of the stack comprise a lower density stack coupling region and a higher density stack coupling region, wherein the higher density stack coupling region has the first density of trace structures and has the second density of connection structures. In particular, said density may denote an integration density. The term "density", in particular "integration density", may denote a number of electrically conductive structures (in particular trace structures, connection structures and/or vertical through connections, such as metallic vias) per area or volume of the respective stack coupling region. Hence, the amount of electrically conductive structures in the higher density stack coupling region may be higher than the amount of electrically conductive structures in the lower density stack coupling region. Thus, integration density may mean a quantity of electrically conductive structures per area or volume. The integration density in the lower density stack coupling region can be less than in the higher density stack coupling region, and correspondingly the line space ratio may be different. Since manufacture of a stack coupling region with high integration density may involve a larger effort than manufacture of a stack coupling region with low integration density, a high integration density needs only be manufactured in the stack where needed from a functional point of view. In other portions of the stack in which a low integration density is sufficient for fulfilling a desired function, a simplified manufacturing process can be carried out.

Advantageously, the lower density stack coupling region and the higher density stack coupling region may form integral parts of the same common stack. Thus, the lower density stack coupling region and the higher density stack coupling region do not have to be manufactured separately to be subsequently connected to each other by surface mounting or embedding. In contrast to this, the lower density stack coupling region and the higher density stack coupling region may form part of the same build-up or layer stack. For example, it may be possible that the lower density stack coupling region forms a central portion or a base portion of the layer stack, and that the higher density stack coupling region is formed on said lower density stack coupling region. In one embodiment, the higher density stack coupling region may be formed on only one main surface of the lower density stack coupling region. In another embodiment, two separate higher density stack coupling regions may be formed on both opposing main surfaces of the lower density stack coupling region. Both the lower density stack coupling region and the higher density stack coupling region may extend over the entire width of the component carrier.

In an embodiment, a line pitch of the lower density stack coupling region is in a range from 30 μm to 120 μm. In contrast to this, a line pitch of the higher density stack coupling region may be in a range from 2 μm to below 30 μm (in particular from 2 μm to 25 μm). Furthermore, wherein a line pitch of the further electrically conductive layer structures may be in a range from 0.4 μm to 10 μm. The term "line pitch" may denote a sum of a broadness of a metal trace and a broadness of dielectric material. With the described design rule in terms of line pitch, the lower density stack coupling region may be manufactured in a very simple way. In order to match with the demanding line pitch properties of the further stack, the higher density stack coupling region may have an intermediate value of the line pitch, i.e., larger than of the further stack but smaller than that of the lower density stack coupling region. This combines a reasonable manufacturing effort with a reliable electric coupling between stack and further stack, including its respective component(s).

In an embodiment, at least one of the at least one first component and the at least one second component comprises at least one of the group comprising a processor chip, a memory chip, a wafer level package, a bridge die (which may be used for interconnecting two other dies), stacked dies (i.e., a plurality of dies mounted on top of each other), and an interposer (which may be an inlay or board being vertically sandwiched between two layer structures or other components to be interconnected by the interposer). The aforementioned interposer may for example be an active interposer. For example, one component may be a processor chip and the further component may be a memory chip or a sensor chip interconnected with the processor chip, in particular by the trace structures and connection structures.

In an embodiment, at least part of the further connection structures is located at a bottom main surface of the further stack. In the context of the present application, the term "main surface of the further stack" may particularly denote one or more largest planar surface area(s) of the further stack. Usually, a for instance substantially cuboid or plate-shaped further stack may have two opposing main surfaces in the form of two horizontal surface areas on top and on bottom of the further stack. Thus, the main surface may be different from the sidewalls of the further stack. The further stack may preferably comprise two main surfaces parallel and opposite to each other, preferably spaced with respect to each other by the thickness of the further stack. In an embodiment, the further stack only has one side (which may be the bottom side) with electrical connections, so that a planar arrangement of further connection structures will then be present only on the bottom side of the further stack.

In an embodiment, at least part of the further connection structures is located at a top main surface of the further stack. In an embodiment, in which further connection structures are also provided on a top main surface of the further stack facing away from the other stack, the vertical stacking may be continued, for instance by placing yet another stack or yet another component on a top main surface of the further stack. In a corresponding embodiment, at least one further connection structure of the bottom main surface may be connected to at least one further connection structure of the top main surface through electrically conductive structures or elements inside the further stack. This may include the use of a redistribution and/or fan out structure.

In an embodiment, the second density of connection structures and the fourth density of further connection structures differ from each other by not more than +/−5%, in particular are substantially the same. In order to accomplish a proper electric connection between the top side of the stack and the bottom side of the further stack, completely matching arrangements of connection structures and further connection structures may be advantageous. By dividing the complexity into the different layer structures it may be possible to achieve a homogenous density in each of the stacks.

For instance, the arrangement of connection structures and the arrangement of further connection structures may be fully aligned, as shown for instance in FIG. 2.

In an embodiment, the further connection structures are arranged at a main surface of the further stack facing the stack. All further connection structures may be coplanar at a bottom main surface of the further stack. This may lead to a very short electric connection path between the connection structures and the further connection structures, when the latter are arranged on a top main surface of the stack. This may have the advantage of a faster and more reliable transfer of data and/or current through the short electric connections. Hence, all connection structures may be coplanar or almost coplanar at a top main surface of the stack.

In another embodiment, some or all of the further connection structures are arranged at a main surface of the further stack facing away from the stack. By providing a further electric interface at a top main surface of the further stack, three-dimensional integration may be enhanced. For instance, still another stack (which may also have at least one assigned component) may then be mounted on top of the further stack.

In an embodiment, the component carrier comprises yet another stack comprising a plurality of other electrically conductive layer structures having a fifth density of other trace structures and a sixth density of other connection structures. Furthermore, at least one third component may be embedded in (or surface mounted on) the other stack. The second density of connection structures of the stack and the sixth density of other connection structures may differ from each other by not more than +/−20%. The first density of trace structures of the stack may be lower than the fifth density of other trace structures. The stack and the other stack may be connected with each other by the connection structures of the stack and by the other connection structures of the other stack. The at least one first component and/or the at least one second component may be connected to the at least one third component. To describe it briefly, yet another stack may be mounted on the stack, in particular side-by-side with the further stack. The electric connection between stack and other stack may correspond to the electric connection between stack and further stack. In particular, the above-mentioned higher density stack coupling region used for coupling the stack with the further stack may extend up to a region below the other stack, so that a common high density stack coupling region of the stack may be used for electrically coupling at least one component assigned to the further stack with at least one component assigned to the other stack. This may simplify the manufacture of the stack and may ensure simultaneously a proper electric coupling between the stack and multiple additional stacks (and optionally corresponding components) mounted thereon. By taking this measure, also the third component may be involved in the coupling architecture with the first and second components.

In an embodiment, the component carrier comprises at least one other component being mounted on a main surface of the further stack which main surface faces away from the stack. Apart from the surface mounted at least one further stack, one or more other components may be surface mounted on the main stack as well.

In an embodiment, the stack has an asymmetric build-up. The component carrier may be provided with a central core having a respective build-up on each of the opposing main surfaces thereof. For instance, only one main surface may be equipped with at least one further stack, and optionally with at least one surface mounted component. By properly designing the constituents of the component carrier, excessive warpage can be avoided despite of the asymmetrical build up on both sides of the core.

Exemplary embodiments may involve a configuration of the component carrier with coreless build-up and/or with a multilayer core. For example, a core provided in the stack in some embodiments (see reference sign 164 in FIG. 1) may be substituted by a dielectric multilayer. In some embodiments, the stack may be free of a core, i.e., may have a coreless build-up. Such a coreless build-up may be preferred in particular in case of an uneven number of electrically conductive layers to prevent warpage. For example, a fan-out package on a coreless substrate may be provided. A fan-out package may be bigger than a naked die. For instance, a fan-out package may have a redistribution structure.

In an embodiment, the further stack is mounted at least partially in a recess of the stack. Additionally or alternatively, at least one component may be mounted in the recess. Such a recess may be formed in a main surface of the stack. By assembling the further stack in such a recess, a complex design in vertical direction may be obtained. This may allow to achieve a further miniaturization.

In an embodiment, the further stack is configured as a chiplet. Such a chiplet may be an integrated circuit block that has been specifically designed to work with other similar chiplets to form larger more complex component carrier-type modules. In such modules, a system may be subdivided into functional circuit blocks, i.e., said chiplets, that may be made of reusable blocks. However, it is also possible that the further stack is configured as a package accommodated at least partially in a cavity (which may be denoted as 2.5D package), as package comprising vertically stacked semiconductor chips (which may be denoted as 3D package). Furthermore, it is possible that the component carrier comprises a chiplet mounted on the further stack. It is possible that one or more chiplets are mounted on the further stack. It may also be that the stack itself carries one or more chiplets. In a 3D-package, chips may be stacked on each other.

In an embodiment, the stack comprises at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). In another embodiment, the substrate may be substantially larger than the assigned component (for instance in a flip chip ball grid array, FCBGA, configuration) . More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, magnesium, carbon, (in particular doped) silicon, titanium, and platinum. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one further component may be embedded in and/or surface mounted on the stack. The component and/or the at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs), indium phosphide (InP) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component.

Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), Electroless Nickel Electroless Palladium Immersion Gold (ENEPIG), gold (in particular hard gold), chemical tin (chemical and electroplated), nickel-gold, nickel-palladium, etc. Also nickel-free materials for a surface finish may be used, in particular for high-speed applications. Examples are ISIG (Immersion Silver Immersion Gold), and EPAG (Electroless Palladium Autocatalytic Gold).

The aspects defined above and further aspects of the invention are apparent from the examples of embodiment to be described hereinafter and are explained with reference to these examples of embodiment.

BRIEF DESCRIPTION OF THE DRAWINGS

FIG. 2 schematically illustrates a plan view of part of the component carrier according to FIG. 1.

FIG. 3 illustrates a cross-sectional view of a component carrier according to another exemplary embodiment of the invention.

FIG. 4 illustrates a cross-sectional view of a component carrier according to still another exemplary embodiment of the invention.

FIG. 5 illustrates a cross-sectional view of a component carrier according to yet another exemplary embodiment of the invention.

FIG. 6 illustrates a cross-sectional view of a component carrier according to still another exemplary embodiment of the invention.

FIG. 7 illustrates a plan view of a component carrier according to still another exemplary embodiment of the invention.

FIG. 8 illustrates a plan view of a component carrier according to still another exemplary embodiment of the invention.

FIG. 9 illustrates a plan view of a component carrier according to still another exemplary embodiment of the invention.

FIG. 10 illustrates a plan view of a component carrier according to still another exemplary embodiment of the invention.

DETAILED DESCRIPTION OF ILLUSTRATED EMBODIMENTS

Figure 1:
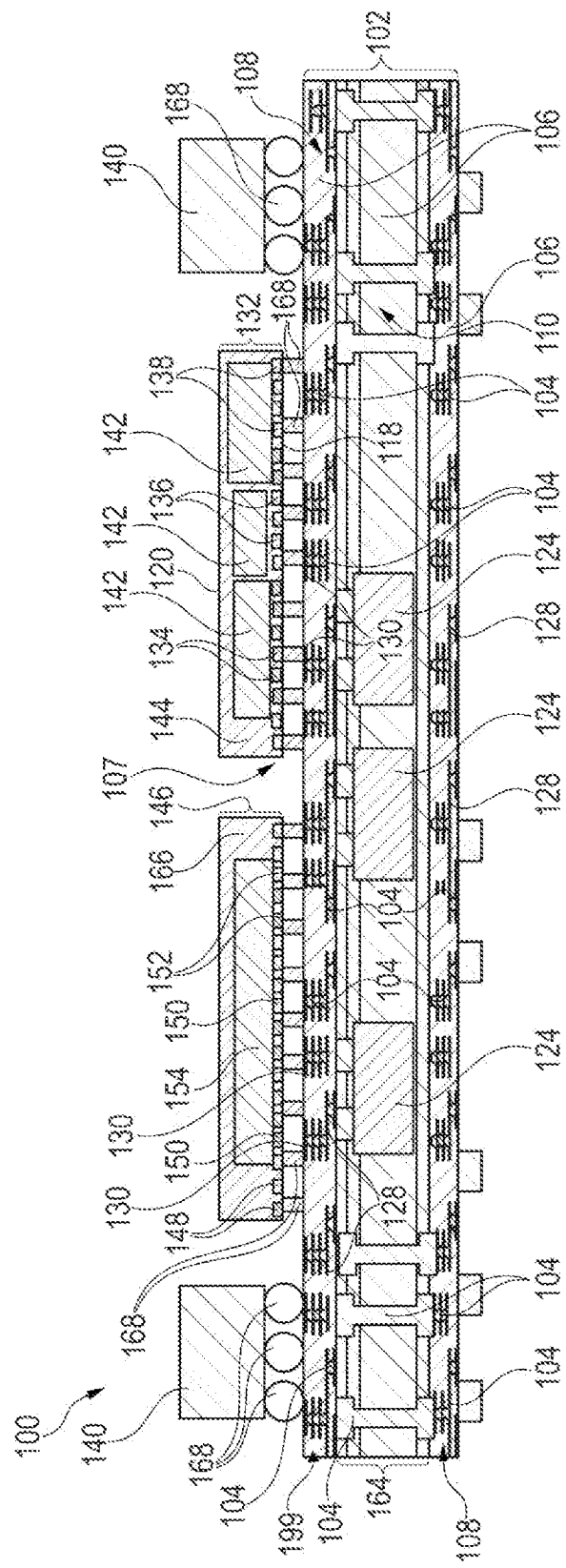
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier, such as an integrated circuit (IC) substrate or a printed circuit board (PCB), comprises a laminated layer stack (which also may be denoted as a main stack) with trace structures (in particular embodied as a wiring) of a first integration density and connection structures (such as pads and/or pillars) of a second integration density. For instance, the connection structures may be coplanar in a connection plane, such as a horizontal plane, of the stack. Beyond this, the component carrier may comprise a further layer stack (which may also be denoted as additional stack) with further trace structures (in particular, trace structure having a third density). To describe it briefly, the integration density of trace structures may be higher in the further stack compared with the stack. In other words, a wiring structure of the further stack may be denser than a wiring structure of the stack. Hence, only the connection structures may be provided matching for the stacks, whereas there may be a high freedom of design in terms of setting the density of the trace structures in accordance with the needs of a specific application. For example, the first density may be more than 20% larger than the third density (in particular, the difference between the third density and the first density divided by the third density may be at least 0.2). For assembling the component carrier, the stack and the further stack may be connected with each other by connecting the connection structures of the stack with the further connection structures of the further stack. For instance, said connection may be accomplished by soldering, sintering, an electrically conductive glue, or thermocompression bonding. By the described connection scheme, it may also be possible to electrically connect one or more first components applied to (for instance embedded in and/or surface mounted on) the stack to one or more second components being embedded in the further stack. By taking this measure, a functional connection between different components (preferably semiconductor chips) assigned to different stacks of a common PCB-type component carrier may be accomplished along a short connection path, which is advantageous in terms of signal integrity. In particular, signal losses may be reduced and signal quality may be improved. These advantageous effects can be combined with a simple manufacturability of the component carrier, since demanding high integration densities need only be provided specifically in a respective one of the stacks where functionally needed. In particular, an exemplary embodiment of the invention may provide an ultrahigh density fan-out architecture on a substrate.

Advantageously, the stack may have a bigger surface area than the further stack (and the optional other stack). That said, the further (and the optional other) stack may be totally surface mounted on stack main surface without overhang (see figures described below).

According to a preferred embodiment, the main stack may comprise a first portion embodied as a higher density stack coupling region and a second portion embodied as a lower density stack coupling region. The higher density stack coupling region may have a higher integration density than the lower density stack coupling region. The higher density stack coupling region may be connected to the further stack, whereas the lower density stack coupling region may be spaced with respect to the further stack by the higher density stack coupling region. Both the first portion and the second portion may form integral parts of the common main stack. Advantageously, the higher density stack coupling region can be used for connecting the additional or further stack. Only here a locally increased integration density is needed in order to enable a matching connection with the further stack with its higher integration density. In order to save manufacturing resources, a remaining other portion of the stack apart from a connection to the further stack may be realized as simple lower density stack coupling region. Such a manufacturing architecture may combine an excellent reliability and a high performance with a reasonable manufacturing effort.

Conventionally, a high-density layer has been manufactured separately and has then been embedded in or assembled to a layer stack. This is cumbersome. In other embodiments, an entire component carrier has been manufactured as high density stack. This involves an excessive manufacturing effort.

In order to overcome the above-mentioned and/or other shortcomings at least partially, an exemplary embodiment of the invention provides a component carrier configured as fan-out package with a split high-density connection on substrate layers.

According to an exemplary embodiment, a component carrier is provided which comprises a stack comprising a plurality of electrically conductive layer structures and at least one electrically insulating layer structure, wherein the electrically conductive layer structures comprise a lower density stack connection region and a higher density stack connection region, and a first component and a second component both being surface-mounted on the stack, wherein the first component has a component connection region having a connection density differing not more than +/−20% from a connection density of the higher density stack connection region, wherein the first component and the second component are electrically coupled with each other by the higher density stack connection region and by the component connection region. Preferably, also the second component has a component connection region having a connection density differing not more than +/−20% from a connection density of the higher density stack connection region. By connecting two surface mount device-type components with each other on a stack in the described way, it may be possible to separate routing complexity in two parts. A first part of routing complexity may be provided by the higher density stack connection region of the stack. A second part of the routing complexity may be provided by the component connection region of the respective surface mounted component. Advantageously, this may make it dispensable to provide the highest-level routing performance on each of the components and on the substrate. In contrast to this, different technologies may be matched to distribute connection resources between components and stack. As a result, a component carrier with high reliability may be obtained.

According to such an embodiment, it may be possible to mount at least one fan-out package (in particular containing one or more components) with one or more high density routing layers on an IC (integrated circuit) substrate with one or more high density routing layers to split a requested routing density between stack and components. Moreover, at least part of the involved components may be embedded to support an improved power delivery. To put it shortly, exemplary embodiment may split a high-density connection partially in a fan-out package and partially on substrate layers.

Exemplary embodiments may have advantages. In particular, it may be possible to improve or even optimize routing layers by splitting density layers. Furthermore, high density routing layers in a fan-out package may lower the demand of routing density on a substrate. Beyond this, high density routing on a fan-out region can be achieved easier and with higher yield. Advantageously, routing between components within a fan-out package can be outsourced to a mainboard. Moreover, a known good fan-out package may be provided on a known good substrate, which may further increase the yield. Furthermore, the manufacturing architecture according to exemplary embodiments of the invention may lead to a height reduction of the obtained component carrier. A high freedom of design may be achieved by the opportunity of integrating active and/or passive components, in embedding technology and/or by surface mounting. By accomplishing component-to-component coupling by matching connection structures of stack and a further stack, substrate embedded bridge dies as well as patch redistribution layers may be dispensable.

Exemplary applications of exemplary embodiments of the invention are high performance computing applications, server/cloud applications, chiplets, advanced driver assistance systems, and modules or packages involving artificial intelligence (AI).

FIG. 1 illustrates a cross-sectional view of a component carrier 100 according to an exemplary embodiment of the invention. FIG. 2 illustrates schematically a plan view of part of the component carrier 100 according to FIG. 1.

The component carrier 100 according to FIG. 1 may comprise a substantially plate-shaped IC (integrated circuit) substrate or a printed circuit board (PCB). Thus, the component carrier 100 shown in FIG. 1 may be highly compact in a vertical direction. More specifically, the component carrier 100 may comprise a stack 102 comprising electrically conductive layer structures 104 and electrically insulating layer structures 106. The electrically conductive layer structures 104 may comprise patterned metal layers (such as patterned copper foils or patterned deposited copper layers) and vertical through connections, for example copper filled vias which may be created by drilling and plating. The electrically insulating layer structures 106 may comprise a respective resin (such as a respective epoxy resin), preferably comprising reinforcing particles therein (for instance glass fibers or glass spheres). For instance, the electrically insulating layer structures 106 may be made of FR4. The electrically insulating layer structures 106 may also comprise resin layers being free of glass fibers.

Now referring to FIG. 2, a plan view of stack 102 is shown and will be explained in the following.

As can be taken from FIG. 2, part of the electrically conductive layer structures 104 has a first density of trace structures 128 and a second density of connection structures 130. The trace structures 128 may define a wiring structure for conducting electric signals. The connection structures 130 may be pads (or alternatively pillars) for accomplishing an electric connection between the stack 102 and below described further connection structures 138 of a further stack 132. For example, the connection structures 130 may be coplanar and may extend for example in the paper plane of FIG. 2. Also, the trace structures 128 may extend within a common plane, i.e., may be coplanar. It is however also possible that the connection structures 130 extend in different planes and/or that the trace structures 128 extend in different planes. One, some or all of the trace structures 128 and one, some or all of the connection structures 130 may be electrically coupled with each other. Reference sign 160 shows a rectangle corresponding to an area of stack 102. The density of the connection structures 130 may be calculated as the number of connection structures 130 of stack 102 (six in the shown example) divided by the area of rectangle 160. Correspondingly, the density of the trace structures 128 may be the number of trace structures 128 of stack 102 (six in the shown example) divided by the area of rectangle 160.

As also shown in FIG. 1 and FIG. 2, a further stack 132 is mounted on top of the stack 102. For example, further stack 132 may be a laminated layer stack with components 142 mounted thereon and being overmolded by a mold-type encapsulant 144. The components 142 being encapsulated in the encapsulant 144 may be reconnected with each other in the package-type encapsulated further stack 132. More specifically, the components 142 may be connected to each other by routing layers on the bottom surface of the wafer level package-type encapsulated further stack 132. The components 142 may be bare dies.

Further stack 132 may comprise one or more further electrically insulating layer structures shown schematically with reference sign 107 and a plurality of further electrically conductive layer structures 134. The further electrically insulating layer structures 107 can be embodied as described above for electrically insulating layer structures 106 of stack 102. Furthermore, the further electrically conductive layer structures 134 are only shown schematically in FIG. 1 and can be embodied as described above for electrically conductive layer structures 104 stack 102.

Again referring to FIG. 2, at least part of the further electrically conductive layer structures 134 has a third density of further trace structures 136 and has a fourth density of further connection structures 138. The connection structures 130 are respectively connected to the further connection structures 138. The further trace structures 136 may define a wiring structure for conducting electric signals. The further connection structures 138 may be pads (or alternatively pillars) for accomplishing an electric connection between the further stack 132 and the above-described connection structures 130 of the stack 102. For example, the further connection structures 138 may be coplanar and may extend for example in or parallel to the paper plane of FIG. 2. Also, the further trace structures 136 may extend within a common plane, i.e., may be coplanar. It is however also possible that the further connection structures 138 extend in different planes and/or that the further trace structures 136 extend in different planes. One, some, or all of the further trace structures 136 and one, some, or all of the further connection structures 138 may be electrically coupled with each other. Reference sign 162 shows a rectangle corresponding to an area of further stack 132. The density of the further connection structures 138 may be the number of further connection structures 138 of further stack 132 (six in the shown example) divided by the area of rectangle 162. Correspondingly, the density of the further trace structures 136 may be the number of further trace structures 136 of further stack 132 (eight in the shown example) divided by the area of rectangle 162.

In view of the foregoing, the second density of connection structures 130 and the fourth density of further connection structures 138 differ from each other only slightly, for instance by about 10% (please note that the drawing of FIG. 2 is only schematic for the purpose of explanation, and is not true to scale). Furthermore, the first density of trace structures 128 is lower than the third density of further trace structures 136.

Hence, the density of the connection structures 130, 138 may be substantially the same in both stacks 102, 132. Consequently, the connection pattern of the connection structures 130 and of the further connection structures 138 may match at least approximately. In other words, the connection structures 130 and the further connection structures 138 may be in alignment, as shown in FIG. 2. Consequently, each of the connection structures 130 may be connected with an assigned one of the further connection structures 138, for instance by soldering or sintering or using an adhesive glue.

In contrast to this, there is no need to have similar densities of tracing structures 128, 136. Hence, tracing structures 128, 136 may be freely designed for stack 102 and further stack 132 separately, which increases the freedom of design.

Again referring to FIG. 1, several first components 124, 140 are applied to the stack 102. More specifically, said first components 124, 140 comprise a plurality of embedded components 124 and a plurality of surface mounted components 140.

The embedded components 124 are embedded in stack 102, more specifically in a core 164 thereof. However, in other embodiments core 164 may be substituted by a dielectric multilayer. In a coreless embodiment (which may be implemented with or without embedding of components), the manufacturing process may omit a core and may start with any sacrificial carrier, for example a glass plate.

The surface mounted components 140 are surface mounted on an upper main surface of the stack 102 on which also the further stack 132 is surface mounted. For example, the embedded components 124 may be passive components, such as capacitors, integrated passive devices (IPDs), power management integrated circuits (PMICs), etc. For instance, the surface mounted components 140 may be high bandwidth memories (HBMs). Also, one or more embedded inductors are possible in an embodiment.

Moreover, a plurality of second components 142 are embedded in the further stack 132. Said second components 142 may be for example central processing units (CPUs), controller chips, etc.

Referring again to FIG. 1 and FIG. 2, the stack 102 and the further stack 132 are connected with each other by the connection structures 130 of the stack 102 and by the further connection structures 138 of the further stack 132. By this connection, also the first components 124, 140 and the second components 142 are electrically connected. This can be accomplished by the electrically conductive layer structures 104 and the further electrically conductive layer structures 134. As a result, the various components 124, 140, 142 may be functionally coupled with each other. Consequently, a common electronic functionality may be provided by the connected and interacting components 124, 140, 142.

As shown in FIG. 1, the second components 142 are encapsulated by an electrically insulating encapsulant 144, such as a mold compound. This protects the surface mounted encapsulated second components 142 against mechanical damage and provides an electric isolation. Moreover, this may prevent oxidation and/or corrosion of the metallic surface of second component 142.

Now referring specifically to stack 102, the electrically conductive layer structures 104 comprise higher density stack coupling regions 108 and a lower density stack coupling region 110 in between. The upper higher density stack coupling region 108 has the first density of trace structures 128 and has the second density of connection structures 130. According to FIG. 1, the lower density stack coupling region 110 corresponds to a central portion of the stack 102. Two higher density stack coupling regions 108 are formed on two opposing main surfaces of the central portion of the stack 102, so that the higher density stack coupling regions 108 form exterior main surfaces of stack 102. The central lower density stack coupling region 110 corresponds to a core region of the stack 102. By providing a locally high density of electrically conductive structures only at the two opposing main surfaces of the stack 102 which may function as electronic interfaces to components, boards, etc., a locally higher electronic functionality may be combined with a simple manufacturability of the component carrier 100 in view of the fact that the central portion of stack 102 can be manufactured with low effort.

In an embodiment, the two opposed higher density stack coupling regions 108 may be electrically connected by vertical connection elements or structures, preferably by plated through holes (PTH) which penetrate trough the stack thickness of stack 164.

FIG. 1 shows yet another stack 146 which is surface mounted on the stack 102 side-by-side with the further stack 132. As shown only schematically in FIG. 1, the other stack 146 comprises a plurality of other electrically conductive layer structures 148 having a fifth density of other trace structures 150 and a sixth density of other connection structures 152. To describe it briefly, the other electrically conductive layer structures 148 may be embodied in a corresponding way as the further electrically conductive layer structures 134 of the further stack 132. In particular, the other trace structures 150 may be embodied correspondingly to the further trace structures 136, and the other connection structures 152 may be embodied correspondingly to the further connection structures 138. Also, the line pitch and integration density of the other stack 146 may be similar or identical to the line pitch and integration density of the further stack 132. Correspondingly, a third component 154 (alternatively a plurality of third components) may be embedded in the other stack 146 and may be encapsulated in another encapsulant 166, such as a mold compound. The component 154 may be a bare die. Moreover, the second density of connection structures 130 in the upper higher density stack coupling region 108 and the sixth density of other connection structures 152 in the other stack 146 can differ from each other only slightly (in particular by not more than 20%). In contrast to this, the first density of trace structures 128 in the upper higher density stack coupling region 108 may be (even significantly) lower than the fifth density of other trace structures 150 in the other stack 146 (in particular may differ by more than 20%). As shown, the stack 102 and the other stack 146 are connected with each other by the connection structures 130 of the stack 102 and by the other connection structures 152 of the other stack 146, for instance in a corresponding way as described above for stack 102 and further stack 132.

By the electrically conductive layer structures 104, 134 and 148, the first components 124, 140, the second components 142 and the third component 154 may be electrically connected with each other. In a nutshell, the construction and the stack coupling of the other stack 146 may be corresponding to the construction and the stack coupling of the further stack 132, as described above in detail. For instance, the other stack 146 with the encapsulated third component 154 may be a wafer level package. Stack 146 (and its component 154) and stack 132 (and its components 142) may be electrically connected with each other by the upper higher density stack coupling region 108. At the bottom side of each of stack 146 and stack 132, a routing structure may be formed which contributes to said connection. Said routing structure may comprise, for example, one, two or three layers.

Furthermore, the upper higher density stack coupling region 108 of FIG. 1 may connect different components 142, 154 of stacks 132, 146 being surface-mounted on stack 102. Advantageously, this architecture may split high density connection resources partially in surface-mounted fan-out packages and partially on substrate layers.

As can be taken from the dimensions of the elements of the electrically conductive layer structure 104 in FIG. 1, a line pitch of the lower density stack coupling region 110 (for example 50 µm) may be larger than a line pitch of the higher density stack coupling regions 108 (for example 10 µm). Hence, although forming part of the same printed circuit board-type or integrated circuit substrate-type stack 102, different integration densities may be realized in regions 108, 110. The upper higher density stack coupling region 108 may require a high integration density for coupling high integration density components 142, 154 with each other. However, there are no demanding requirements in terms of integration density for core 164, so that the lower density of lower density stack coupling region 110 may be sufficient here. For a certain application, also the bottom-sided higher density stack coupling region 108 may require a high integration density, for instance for surface mounting further components (not shown in FIG. 1) on the bottom main surface of stack 102. Thus, a higher manufacturing effort for realizing a higher integration density needs to be provided only in those spatial portions where really needed for the function of the component carrier 100 to be manufactured. This may keep the overall manufacturing effort at a reasonable level.

A line pitch of the further electrically conductive layer structures 134 (for example 2 μm), being directly electrically coupled with the embedded second components 142, may be even less than the line pitch in the higher density stack coupling region 108. Hence, the upper higher density stack coupling region 108 may function as an interface between the typically higher line pitch of component carrier technology (as present in core 164) and the typically lower line pitch of semiconductor technology (as present in components 142, 154 being directly coupled with the further electrically conductive layer structures 134 of the further stack 132). Moreover, high density resources may be split between the further stack 132 and the upper higher density stack coupling region 108.

According to FIG. 1, all further connection structures 138 are located at a bottom main surface 118 of the further stack 132. Thus, the further connection structures 138 are all arranged at the bottom main surface 118 of the further stack 132 facing the stack 102. Consequently, an upper main surface 120 of the further stack 132 may be delimited exclusively by dielectric material of mold-type encapsulant 144. This may lead to a compact design and a high electric reliability.

Again referring to FIG. 1, each of the further stack 132, the other stack 146, and components 140 may be surface mounted on stack 102 by electrically conductive connection elements 168. Said electrically conductive connection elements 168 may be for example solder structures, such as solder balls or solder paste. Alternatively, sinter structures, electrically conductive glue and/or metallic pillars (for example copper pillars) may be used for accomplishing such an electric connection.

Concluding, the embodiment of FIG. 1 provides ultrahigh density layers on a substrate (see higher density stack coupling regions 108 of stack 102) between fan-out packages (see stacks 132, 146 with embedded components 142, 154) and/or high-bandwidth memory components (compare components 140). Furthermore, ultrahigh density layers may also be provided on a coupling interface of the fan-out packages to be interconnected. Optional embedded passive components 124 in stack 102 are shown as well. Advantageously, the described embodiment divides complexity in terms of integration density between ultrahigh density layers in the packages and local ultrahigh density layers on the board.

Preferably, there may be higher density copper portions in the first density of trace structures 128 in the area below first components 140 and/or the further stack 132 and/or the area between first components 140 and/or the further stack 132 to connect said two elements. However, there may be some portions in the first density of trace structures 128 where there is less copper loading in the stack 102 (preferably not under the components and between them). In other words, not all layers need to be made of copper, for instance none or one as indicated with an arrow 199 in FIG. 1.

For manufacturing a component carrier 100 such as the one shown in FIG. 1, it is for example possible it will carry out subtractive processes (such as chemical and/or physical etching processes using proper masks) for creating the lower density stack coupling region 110. Advantageously, additive processes (such as modified semi additive processing, mSAP, or semi additive processing, SAP) and/or a nanoimprint lithography (NIL) process may be preferably used to manufacture the higher density stack coupling region 108. Additionally and/or alternatively, a subtractive process may be used for processing the higher density stack coupling region 108, and vice versa additive processes may be used for processing the lower density stack coupling region 110. For creating a high-density stack coupling region 108, also a trenching process (for instance using a photo process, a plasma etching process, a laser process) may be used as well.

FIG. 3 illustrates a cross-sectional view of a component carrier 100 according to another exemplary embodiment of the invention.

A main difference between the embodiment of FIG. 3 and the embodiment of FIG. 1 is that, in the embodiment according to FIG. 3, other components 126 are mounted on a top main surface 120 of the further stack 132, said top main surface 120 facing away from the stack 102. In order to make this possible, some of the further connection structures 138 extend up to the top main surface 120 of the further stack 132 and are used for electrically connecting the other components 126 by additional electrically conductive connection elements 168 (such as solder structures). In the shown embodiment, the connection of the one or more other components 126 on top of the further stack 132 may be accomplished by one or more vertical through connections (such as metal pillars or metallic vias) extending vertically through the encapsulant 144 up to the other main surface 120 of the further stack 132. For example, the other components 126 may be a central processing unit (CPU) and/or a memory chip. According to FIG. 3, the further stack 132 functions as molded interposer assembled on substrate-type stack 102. The component 142 encapsulated in the package-type stack 132 may be a bridge die for accomplishing ultrahigh density connections within the package-type stack 132. Such a bridge die may include interior circuitry coupled with the other components 126 for appropriately coupling electric signals between the other components 126.

As core 164, any multilayer or any other layer boards may be used.

FIG. 4 illustrates a cross-sectional view of a component carrier 100 according to still another exemplary embodiment of the invention.

A main difference between the embodiment of FIG. 4 and the embodiment of FIG. 1 is that, in the embodiment according to FIG. 4, one of the surface mounted first components 140 is arranged in a lateral recess 156 at a lateral side of stack 102. Furthermore, the stack 102 according to FIG. 4 includes only a single bottom-sided lower density stack coupling region 110 and a single top-sided higher density stack coupling region 108. Thus, stack 102 according to FIG. 4 and therefore component carrier 100 as a whole have an asymmetrical build up.

FIG. 5 illustrates a cross-sectional view of a component carrier 100 according to yet another exemplary embodiment of the invention.

A main difference between the embodiment of FIG. 5 and the embodiment of FIG. 1 is that, in the embodiment according to FIG. 5, a lower portion of the further stack 132 is mounted in a central recess 156 of the stack 102. Consequently, the height of the component carrier 100 can be reduced. In other words, cavity 156 in the ultrahigh density layers of the upper higher density stack coupling region 108 may decrease the overall thickness of the component carrier 100.

Although the other stack 146 is omitted in the embodiment of FIG. 5, it can be present in yet another embodiment and can be assembled in cavity 156 as well.

FIG. 6 illustrates a cross-sectional view of a component carrier 100 according to still another exemplary embodiment of the invention.

A main difference between the embodiment of FIG. 6 and the embodiment of FIG. 1 is that, in the embodiment according to FIG. 6, the other stack 146 is substituted by a fan-out package 170. Fan-out package 170 may have any configuration being different from FIG. 1. Moreover, the surface mounted devices on stack 102 are in mutual alignment at upper main surfaces according to FIG. 6, thereby further reducing the thickness of the component carrier 100. This may be achieved by arranging the thicker components 140 in cavities 156.

FIG. 7, FIG. 8, FIG. 9, and FIG. 10 illustrate plan views of component carriers 100 according to exemplary embodiment of the invention configured as a chiplet. Hence, FIG. 7 to FIG. 10 shows the flexible design of the manufacturing architecture of the present disclosure. In these embodiments, components 140 may be for instance high-bandwidth memories. Furthermore, an additional controller chip component 172 may be provided as well in some of these embodiments.

Figure 11:
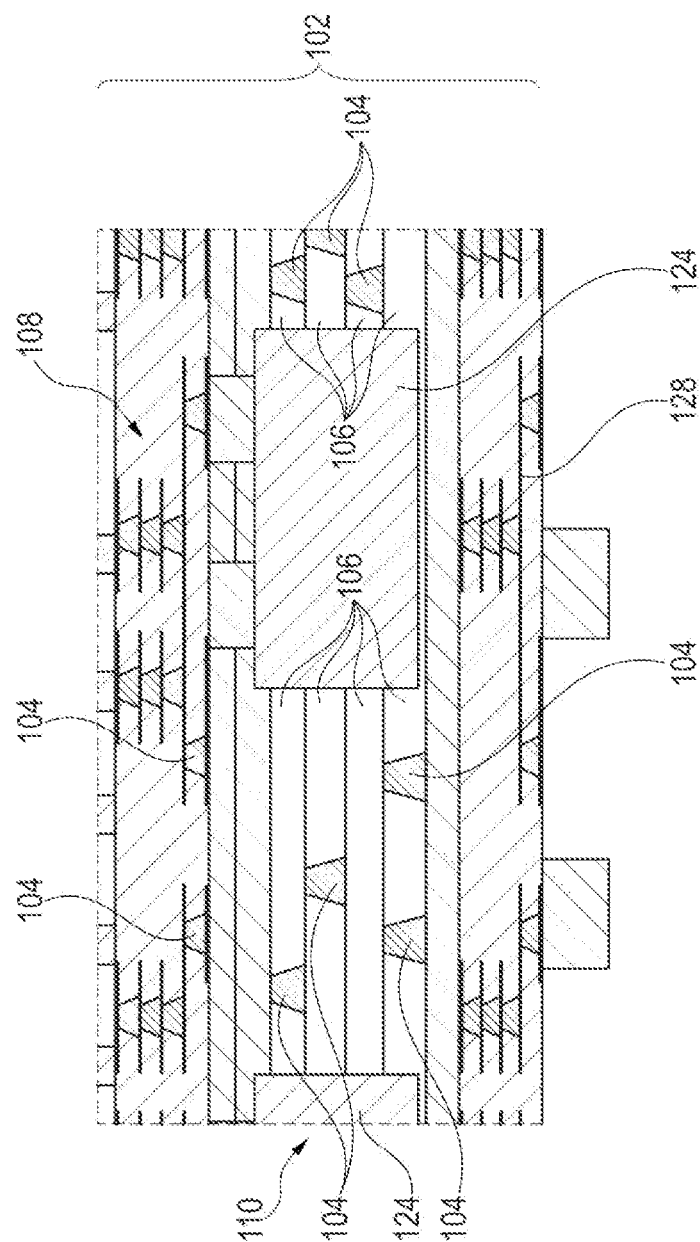
FIG. 11 illustrates a cross-sectional view of a portion of a component carrier according to yet another exemplary embodiment of the invention.

FIG. 11 illustrates a cross-sectional view of a portion of a component carrier 100 according to yet another exemplary embodiment of the invention.

Descriptively speaking, FIG. 11 shows a portion of component carrier 100 according to FIG. 1 with a different dielectric configuration in a central portion. To put it shortly, core 164 of FIG. 1 has been substituted by a multilayer build-up which is also coreless according to FIG. 11. A corresponding central portion of stack 102 is formed by a sequence of stacked electrically insulating layer structures 106 (such as laminated resin or prepreg layers) in which a plurality of electrically conductive layer structures 104 (in the shown embodiment copper filled laser vias which are all tapering in the same direction) are formed. Advantageously, such kind of build-up may further homogenize and balance the stack-up. Thus, a thinner build-up can be realized having also only a little bit warpage. With such a kind of build-up structure the density can also be more relaxed, as more layers can be realized with the same thickness compared to another embodiment with a core 164. In case of an asymmetric layer count, it may be possible that at least on one layer, another insulating material can be chosen to relax the mechanical stress. This is of course strongly related to the circuitry design.

Next, a further embodiment will be explained referring in particular to the embodiments of FIG. 1 and FIG. 11 with modifications. According to such an embodiment of the invention, a component carrier 100 is provided which comprises a stack 102 comprising at least one electrically insulating layer structure 106 and a plurality of electrically conductive layer structures 104 at least part of which having a first density of trace structures 128 and a second density of connection structures 130. Moreover, a further stack 132 is provided which comprises at least one further electrically insulating layer structure 107 and a plurality of further electrically conductive layer structures 134 at least part of which having a third density of further trace structures 136 and a fourth density of further connection structures 138. Optionally, at least one first component is applied to the stack 102. The connection structures 130 are respectively connected to the further connection structures 134. The first density of trace structures 128 is lower than the third density of further trace structures 136. The stack 102 and the further stack 132 are connected with each other by the connection structures 130 of the stack 102 and by the further connection structures 138 of the further stack 132.

Advantageously, the at least one electrically insulating layer structure 106 of stack 102 comprises at least two sub-structures made of different dielectric materials. In particular, the electrically insulating material of one or more of the electrically insulating layer structures 106 of one or more higher density stack coupling regions 108 (i.e., dielectric material surrounding trace structures 128 and connection structures 130) may be different from the electrically insulating material of one or more electrically insulating layer structures 106 of the one or more lower density stack coupling region 110 (such as material of core 164 according to FIG. 1 or central electrically insulating layer structures 106 according to FIG. 11). The selection of different electrically insulating materials of electrically insulating layer structures 106 of the one or more higher density stack coupling regions 108 compared with the one or more lower density stack coupling region 110 may be performed to balance the mechanical stress or to optimize the shape of the trace structures 128, 136. In one embodiment, core 164 comprises FR4 material, whereas the electrically insulating layer structures 106 of the one or more higher density stack coupling regions 108 may be made of a build-up film. In another embodiment, the electrically insulating layer structures 106 of the one or more lower density stack coupling regions 110 may comprise a build-up film, and the electrically insulating layer structures 106 of the one or more higher density stack coupling regions 108 comprises photoimageable dielectric (PID) material or material suitable for a nanoimprint process (such as nano imprint lithography, NIL). Thus, all kind of combinations of dielectric material may be possible depending on the design of the component carrier 100. In a further embodiment, the layer stack 102 comprises organic material and is produced with PCB-based technologies, wherein the further layer stack 132 is produced with wafer-level technologies and/or comprises inorganic material (like silicon).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   a first stack comprising at least one first electrically insulating layer structure and a plurality of first electrically conductive layer structures at least part of which having a first density of first trace structures and a second density of first connection structures,
   wherein the first trace structures and the first connection structures are connected;

a second stack comprising at least one second electrically insulating layer structure and electrically conductive layer structures having a third density of second trace structures and a fourth density of second connection structures,
wherein the second trace structures and the second connection structures are connected;
at least one first component electrically coupled to the first stack, wherein the at least one first component comprises at least one component embedded in the first stack and/or at least one component surface mounted on the first stack; and
at least one second component embedded in the second stack;
wherein the first connection structures are respectively connected to the second connection structures;
wherein the first density of first trace structures is lower than the third density of second trace structures;
wherein the first stack and the second stack are connected with each other by the first connection structures of the first stack and by the second connection structures of the second stack;
wherein the at least one first component is connected to the at least one second component; and
wherein the second stack is surface-mounted on the first stack.

2. The component carrier according to claim 1, wherein the at least one second component is encapsulated by an electrically insulating encapsulant.

3. The component carrier according to claim 1, wherein the first electrically conductive layer structures comprise a lower density stack coupling region and a higher density stack coupling region, wherein the higher density stack coupling region has the first density of first trace structures and has the second density of first connection structures.

4. The component carrier according to claim 3, wherein a line pitch of the lower density stack coupling region is in a range from 30 µm to 120 µm.

5. The component carrier according to claim 3, wherein a line pitch of the higher density stack coupling region is in a range from 2 µm to below 30 µm.

6. The component carrier according to claim 1, wherein a line pitch of the second electrically conductive layer structures is in a range from 0.4 µm to 10 µm.

7. The component carrier according to claim 1, wherein at least one of the at least one first component and the at least one second component comprises at least one of the group comprising a processor chip, a memory chip, a wafer level package, a bridge die, stacked dies, and an interposer, in particular an active interposer.

8. The component carrier according to claim 1, wherein at least a portion of the second connection structures is located at a bottom main surface of the second stack.

9. The component carrier according to claim 1, wherein at least a portion of the second connection structures is located at a top main surface of the second stack.

10. The component carrier according to claim 1, wherein the second density of first connection structures and the fourth density of second connection structures differ from each other by not more than +/−20%.

11. The component carrier according to claim 1, wherein the second connection structures are arranged at a main surface of the second stack facing the first stack.

12. The component carrier according to claim 1, further comprising:
a third stack comprising a plurality of other third electrically conductive layer structures having a fifth density of fifth trace structures and a sixth density of sixth connection structures, and at least one third component embedded in the third stack;
wherein the second density of first connection structures and the sixth density of third connection structures differ from each other by not more than +/−20%;
wherein the first density of first trace structures is lower than the fifth density of third trace structures;
wherein the first stack and the third stack are connected with each other by the first connection structures of the first stack and by the third connection structures of the third stack; and
wherein the at least one first component and/or the at least one second component is or are connected to the at least one third component.

13. The component carrier according to claim 1, comprising at least one of the following features:
wherein the second stack is configured as chiplet, as a package accommodated at least partially in a cavity, as a package comprising vertically stacked semiconductor chips, and/or comprises a chiplet mounted on the second stack;
wherein a central portion of the first stack comprises a core, a coreless build-up, and/or a multilayer build-up.

14. A method of manufacturing a component carrier, the method comprising:
providing a first stack comprising an electrically insulating layer structure and an electrically conductive layer structure at least part of which having a first density of first trace structures and a second density of first connection structures, wherein the first trace structures and the first connection structures are connected;
providing a second stack comprising a second electrically insulating layer structure and a second electrically conductive layer structure having a third density of second trace structures and a fourth density of second connection structures,
wherein the second trace structures and the second connection structures are connected;
coupling at least one first component to the first stack, wherein the at least one first component comprises at least one component embedded in the first stack and/or at least one component surface mounted on the first stack;
embedding at least one second component in the second stack;
providing the first stack and the second stack so that the second density of first connection structures and the fourth density of second connection structures differ from each other by not more than +/−20%;
providing the first stack and the second stack so that the first density of first trace structures is lower than the third density of second trace structures;
connecting the first stack and the second stack with each other by the first connection structures of the first stack and by the second connection structures of the second stack; and
connecting the at least one first component to the at least one second component,
wherein the second stack is surface mounted on the first stack.

* * * * *